United States Patent [19]
Shin

[11] Patent Number: 5,825,171
[45] Date of Patent: Oct. 20, 1998

[54] UNIVERSAL BURN-IN BOARD

[75] Inventor: Kyung-Mo Shin, Suwon, Rep. of Korea

[73] Assignee: Samsung Electronics Co., Ltd., Suwon, Rep. of Korea

[21] Appl. No.: 739,852

[22] Filed: Oct. 31, 1996

[30] Foreign Application Priority Data

Nov. 9, 1995 [KR] Rep. of Korea ....................... 95-40484

[51] Int. Cl.⁶ .................................................. G01R 31/02
[52] U.S. Cl. .......................................... 324/73.1; 324/760
[58] Field of Search ................................ 34/73.1, 158.1, 34/405–412, 760; 439/49, 52, 189

[56] References Cited

U.S. PATENT DOCUMENTS

| | | | |
|---|---|---|---|
| 4,777,434 | 10/1988 | Miller et al. | 324/158.1 |
| 5,396,185 | 3/1995 | Honma et al. | 324/158.1 |
| 5,659,245 | 8/1997 | Ping et al. | 324/158.1 |

*Primary Examiner*—Ernest F. Karlsen
*Assistant Examiner*—Anh Phung
*Attorney, Agent, or Firm*—William L. Geary, Jr.

[57] ABSTRACT

A universal burn-in board for burning-in semiconductor devices. The universal burn-in board is easily reconfigurable so that it may be used with a variety of semiconductor devices having the same pin configuration but different functional characteristics. The universal burn-in board comprises: a socket having a plurality of connectors where target semiconductors to be burned-in are inserted; a first unit having a first node connected to one of the plurality of connectors, an isolation resistor connected between the first node and a test signal line, a first power node to which power voltage and ground voltage are input, a first ground node and a first passing node connected to the first node; a second unit having a second power node connected to each of the first power node and the first ground node, a second ground node and a second passing node connected to the test signal line; and a selecting unit for selectively connecting the first power node, first ground node and first passing node of the first unit and the second power node, second ground node and second passing node and providing burn-in test signals according to the characteristics of the target semiconductor device pin connected to the first node.

21 Claims, 4 Drawing Sheets

UNIVERSAL BURN-IN BOARD

BACKGROUND OF THE INVENTION

1. Field of the Invention

The present invention relates to a burn-in board for a semiconductor device, and more particularly, to a universal burn-in board which enables the burn-in of semiconductor devices having different pin arrays.

2. Description of the Related Art

A typical semiconductor device is an integrated circuit manufactured by wafer processing, and various tests are performed to test the reliability of the interior circuits of a chip. Such reliability tests are largely divided into a wafer test performed before packaging the chip, and a package test performed after packaging the wafer die, which are well known tests in this field. The wafer test is for testing the normal operation of a chip manufactured by wafer processing, and the package test is for testing the operation of the chip based on the timing and other specifications for the semiconductor device.

A typical test is a burn-in test, which is divided into a wafer burn-in and a package burn-in. The package burn-in test is performed when packaging is completed and connections to the various pins are made by wire-bonding the pads of a chip to the lead frame. In the package burn-in, a number of device under test (DUT) sockets are installed on a burn-in board, thereby allowing a plurality of packaged semiconductor devices to be tested simultaneously.

The package burn-in test has become increasingly important for the purpose of screening of the initial production yield, and to insure product reliability in light of the multi-pin trends of semiconductor device packaging. However, there is a huge cost associated with the use of a high-priced burn-in board, particularly with the increasing pin count and complexity of chips.

A conventional burn-in board is referred to as a dedicated type burn-in board and it is manufactured according to the function and position of the pins of a particular semiconductor device. Thus, there is a problem in that a dedicated burn-in board specially designed for the burn-in of a particular semiconductor device having a function "A" cannot be applied for the burn-in of another semiconductor device having a function "B". In particular, a semiconductor device such as an ASIC (application-specific integrated circuit) often has a short period of mass-production by a semiconductor device manufacturer. When such a short-life-cycle semiconductor device is under mass-production burn-in, the life span of the burn-in board is shorter than that of a burn-in board for a long-life-cycle semiconductor device, thereby raising the cost of the short-life-cycle semiconductor device.

FIG. 1 illustrates the structure of a conventional dedicated burn-in board. A plurality of DUT sockets 14 are spaced at a predetermined distance on a board 12. Each of the connectors 16 in the DUT socket 14 arrayed on the board 12 is connected to test signal output lines Ts of an external test device (not shown) and a power voltage line Vcc and a ground voltage line Vss of a power supply unit (not shown), thereby supplying signals and power to the semiconductor DUT according to its particular configuration.

In FIG. 1, an isolation resistor 18 is connected between a connector 16 to the signal line for test signal TS according to the pin array of the semiconductor DUT and the function of a corresponding pin. The purpose of the isolation resistor 18 is to isolate the connectors of the neighboring DUT sockets 14 connected in parallel on board 12, i.e., to provide isolation between signal input pins of the neighboring semiconductor devices. In the above structure, the isolation resistor is not used for the power supply pin Vdd and ground pin GND of the semiconductor DUT, because of the voltage drop caused by the current flow across the resistor 18. An output pin may be open on the board 12 if the output signal is not measured and there is no need of a signal supply from the outside.

However, since the circuit configuration of the above dedicated burn-in board is for the burn-in of a particular semiconductor device, it cannot be used for a different semiconductor device having the same package form and pin array, because the functional characteristics of the input/output pins are different. Thus, it has been a problem that a dedicated burn-in board manufactured only for a particular semiconductor device does not allow the burn-in of other semiconductor devices having the same package, but different input/output and operating characteristics.

SUMMARY OF THE INVENTION

To solve the above problems, it is an object of the present invention to provide a universal burn-in board which enables the burn-in of different semiconductor devices having the same package, shape, pinout, and format.

It is another object of the present invention to provide a universal burn-in board which enables burn-in by providing burn-in test signals and operating voltages to a target semiconductor device having an array of signal input/output pins, power voltage pins, and ground voltage pins.

To achieve the above object, there is provided a universal burn-in board circuit for burning-in a semiconductor device comprising: a socket having a plurality of connectors where target semiconductors to be burned-in are inserted; a first unit having a first node connected to one of the plurality of connectors, an isolation resistor connected between the first node and a test signal line, a first power node to which power voltage and ground voltage are input, a first ground node and a first passing node connected to the first node; a second unit having a second power node connected to each of the first power node and the first ground node, a second ground node and a second passing node connected to the test signal line; and a selecting unit for selectively connecting the first power node, first ground node and first passing node of the first unit and the second power node, second ground node and second passing node and providing burn-in test signals according to the characteristics of the target semiconductor device pin connected to the first node.

DETAILED DESCRIPTION OF THE PREFERRED EMBODIMENTS

Figure 1:
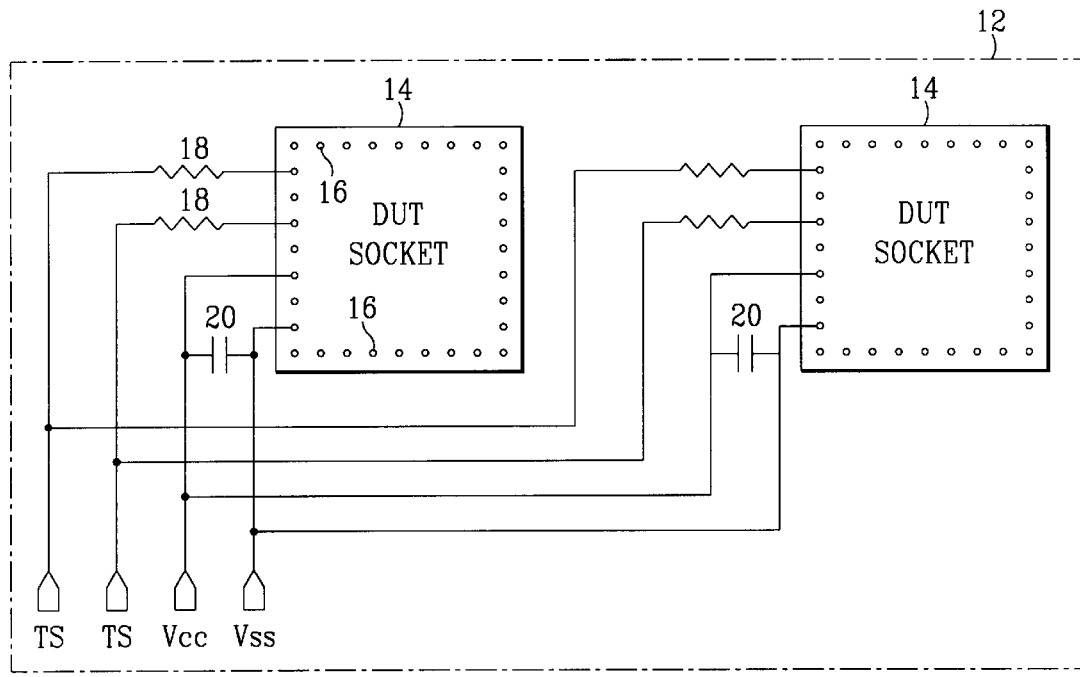
FIG. 1 is a view schematically illustrating a configuration of a conventional dedicated burn-in board.

The structure of a universal burn-in board will now be described by reference to FIG. 2. At least one DUT socket 14 is provided on a board 12 such as a printed circuit board (PCB), and the socket 14 has a plurality of connectors 16 where a target semiconductor DUT is inserted to be burned-in. At the periphery of the DUT socket 14, there is a first node NP which is connected to one connector 16a of the plurality of connectors 16, an isolation resistor 18 which is connected between the first node NP and a test signal line TS, a first power node V1 and a first ground node G1 where power voltage Vcc and ground voltage Vss are input, a first burn-in test signal providing portion 22 having a first passing node P1 which is connected to the first node NP, a first power node V1 which is connected to the second power node V2, and a first ground node G1 connected to a second ground node G2. Capacitors 20 are bypass capacitors for filtering noise components from the power supply.

The circuit of the universal burn-in board having such a structure for each connector pin 16 of the DUT socket 14 where the target semiconductor is inserted, may be configured to provide or not to provide a signal for burn-in to each of the pins of the target semiconductor device. Various configurations are described by reference to FIGS. 3A–3D and FIG. 4. The DUT socket 14 is not limited to a typical pin and socket configuration, but may also include zero insertion force (ZIF) sockets, sockets for surface mount packages, ball grid array (BGA) packages, leadless chip carrier (LCC) packages, and other mechanisms for electrical connection to semiconductor devices.

Figure 3A:
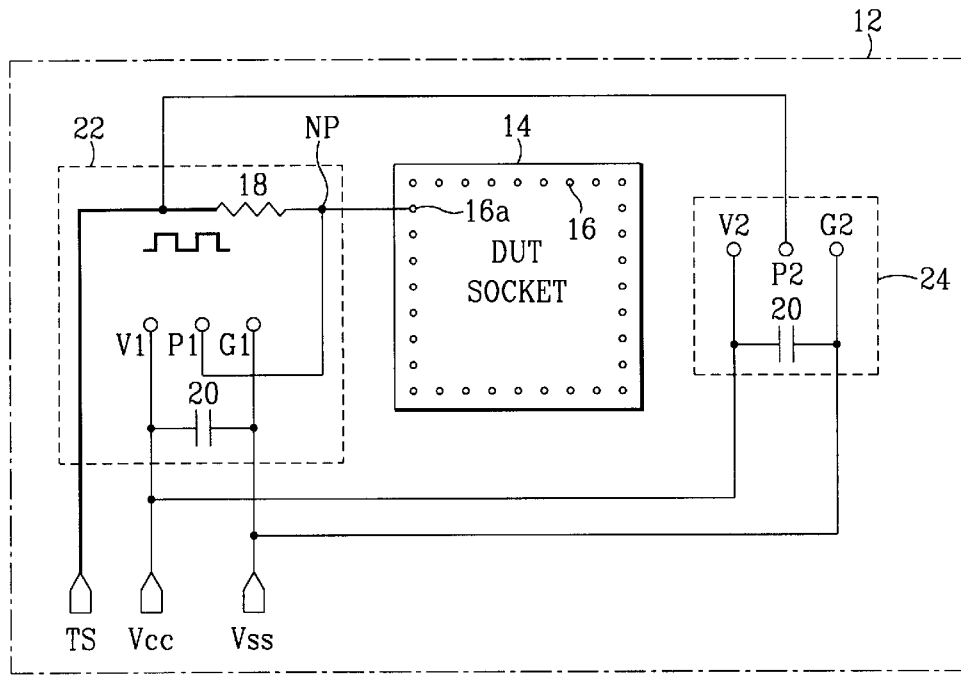
FIGS. 3A–3D are views showing an embodiment where a universal burn-in board as shown in FIG. 2 is adapted to correspond to a particular pinout of a device under test.

In FIG. 3A, when a target semiconductor device is inserted in DUT socket 14, and connector 16a is connected to an input pin of the device, a test signal TS is provided to connector 16a via an isolation resistor 18, thereby reducing signal interference between semiconductor devices inserted into the neighboring DUT sockets.

Figure 3B:
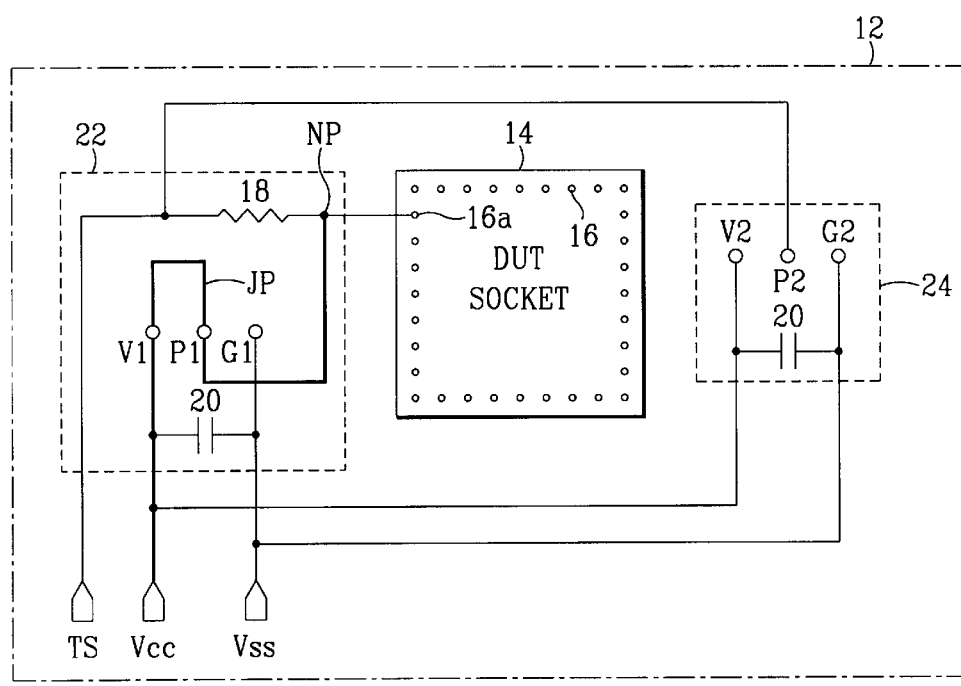

In FIG. 3B, when the pin of the target semiconductor device connected to the connector 16a corresponds to either a power voltage Vdd pin or a ground GND pin, a jumper JP is used in the first burn-in test signal providing portion 22 to selectively connect the first power node V1 and the first passing node P1 for a Vdd connection as shown, or to selectively connect the first ground node G1 and the first passing node P1 for a GND connection (not shown). For instance, when the power voltage pin of a semiconductor device is connected to connector 16a, the power voltage Vcc can be directly provided to the power pin Vdd of the semiconductor device without passing through the resistor 18 by connecting the first power node V1 and the first passing node P1 in the first burn-in test signal providing portion 22 by means of the jumper JP. If a ground pin GND of the semiconductor device is connected to connector 16a, the ground voltage Vss can be directly provided to the ground pin GND of the semiconductor device without passing through the resistor 18 by connecting the first passing node P1 and the first ground node G1 in the first burn-in test signal providing portion 22 by means of the jumper JP (not shown). In FIG. 3B, the jumper JP is shown as connecting Vcc to connector 16a of the DUT socket 14.

Figure 3C:
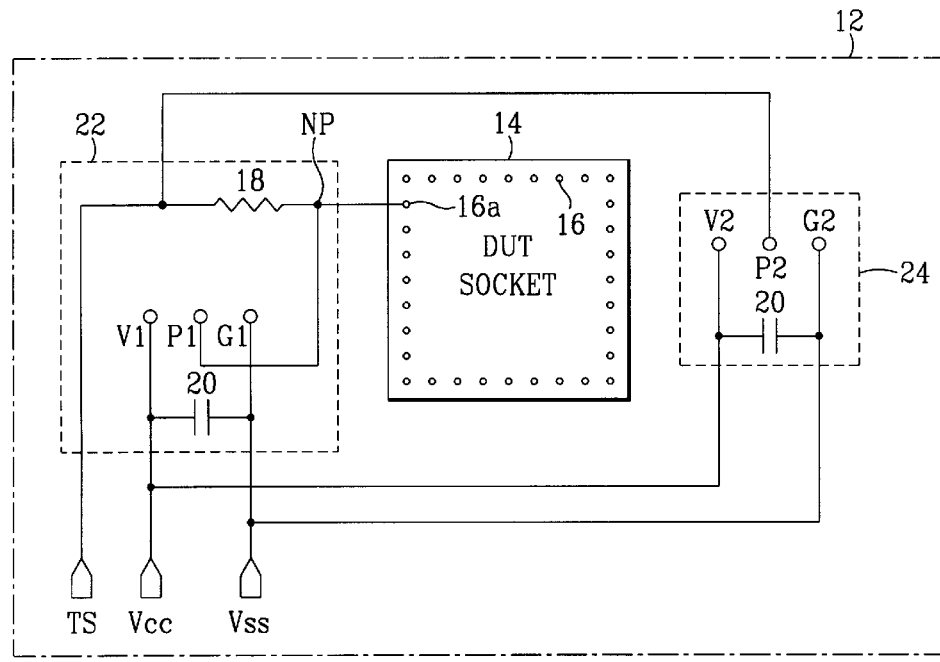

In FIG. 3C, when an output pin of the target semiconductor device is connected to connector 16a of the DUT socket 14, an open circuit may be formed by removing the jumper JP from the first and second test signal providing portions 22 and 24, and by not supplying a burn-in test signal to the test signal line TS.

Figure 3D:
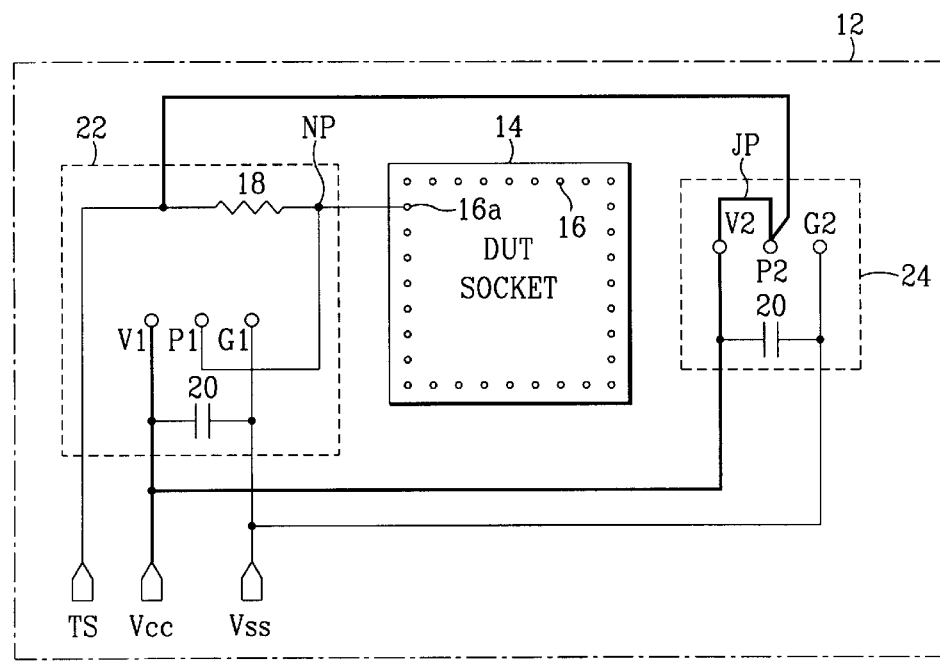

In FIG. 3D, it is illustrated that when the pin of the target semiconductor device connected to connector 16a of the DUT socket 14 is to be maintained in a pull-up or pull-down level for the purpose of enabling the burn-in, the jumper JP is used to selectively connect the second power node V2 and the second passing node P2 for pull-up, or the second ground node G2 and the second passing node P2 for pull-down of the pin connected to connector 16a. For example, as shown in FIG. 3D, by using JP to connect the second power node V2 and the second passing node P2 of the second burn-in test signal providing portion 24, the power voltage Vcc is connected via resistor 18 to connector 16a to pull-up the corresponding pin on the semiconductor DUT. In this configuration, the test equipment (not shown) provides an open circuit to signal line TS.

Figure 2:
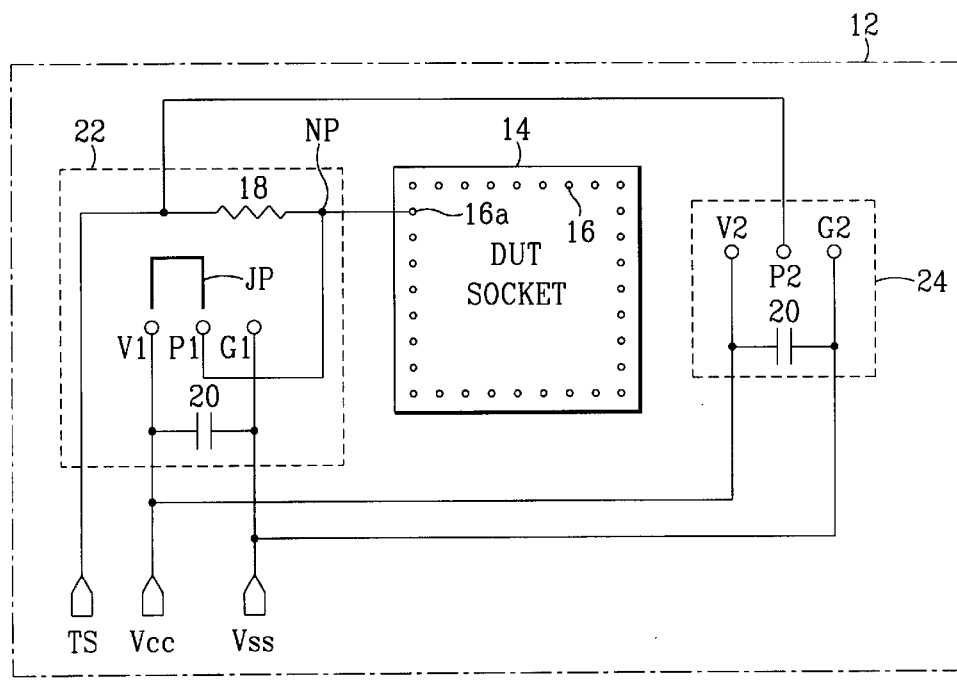
FIG. 2 is a view schematically illustrating a configuration of a dedicated burn-in board according to the present invention.
Figure 4:
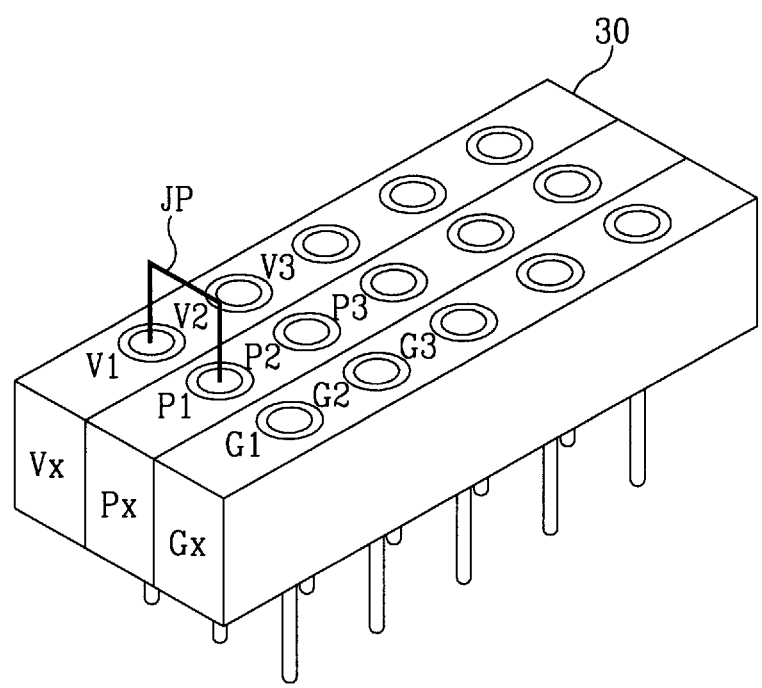
FIG. 4 is a perspective view showing an embodiment where a strip socket is used as first and second burn-in test signal providing portions in FIG. 2.

FIG. 4 illustrates an embodiment realized by using a socket 30 for the first and second burn-in test signal providing portions 22 and 24 shown in FIG. 2. That is, connections are made between the desired nodes by inserting jumpers JP into the socket 30. In this embodiment, the socket 30 may be installed on a printed circuit board without having to solder jumpers JP to the first and second burn-in test signal providing portions shown in FIGS. 2, and 3A–3D. In FIG. 4, a three row strip socket 30 is configured such that the first row $V_x$ contains power nodes $V_1$, $V_2$, etc.; the second row $P_x$ contains passing nodes $P_1$, $P_2$, etc.; and the third row $G_x$ contains ground nodes $G_1$, $G_2$, etc. Alternatively, jumpers JP could be soldered directly to the printed circuit board, or wire-wrap connections may be used. Socket 30 and jumpers JP may be implemented using strip sockets, standard sockets, socket pins, jumper boards, wire-wrap connections, switch mechanisms, cross-bar switches, multi-point switches, fuse mechanisms, electronic switches such as those controlled by programmable read-only memory, wire jumpers, printed circuits, or any other signal routing mechanism. A wire jumper is not limited to a conductor with a circular cross-section, and it may have a square, rectangular, or other cross-section, and be encased in an insulator, plastic or resin molding compound, or other suitable material.

As described above, the present invention provides the proper signals for burn-in to the DUT socket so that various semiconductor devices having the same package type can be tested. It should be understood that the present invention is not limited to the particular embodiments disclosed herein, but rather is defined by reference to the appended claims.

What is claimed is:

1. A universal burn-in board circuit comprising:

a socket having a plurality of connectors where a target semiconductor to be burned-in is inserted;

a plurality of first means each having a first node coupled to one of said plurality of connectors, an isolation resistor coupled between said first node and a test signal input line, a first power node coupled to a power voltage input line, a first ground node coupled to a ground voltage input line, and a first passing node coupled to said first node;

a plurality of second means each having a second power node coupled to said first power node, a second ground node coupled to said first ground node, and a second passing node coupled to said test signal input line; and a plurality of selecting means for selectively coupling said first power node or said first ground node to said first passing node of said first means, and for selectively coupling said second power node or said second ground node to said second passing node of said second means, thereby providing at least one selectable burn-in test signal to said target semiconductor device inserted in said socket.

2. A universal burn-in board circuit as in claim 1, wherein said universal burn-in board circuit is installed on a printed circuit board substrate.

3. A universal burn-in board circuit as in claim 2, wherein said first and second means comprise strip sockets and said selecting means comprises a wire connection.

4. A universal burn-in board circuit as in claim 2, wherein said selecting means comprises a switch.

5. A universal burn-in board circuit as in claim 2, wherein said selecting means comprises a printed circuit.

6. A universal burn-in board circuit as in claim 2, wherein said selecting means comprises a fuse circuit.

7. A universal burn-in board circuit as in claim 2, wherein said selecting means comprises a wire.

8. A universal burn-in board circuit comprising:
  a socket having a plurality of connectors where a target semiconductor to be burned-in is inserted;
  a plurality of first jumper circuits each having a first node coupled to one of said plurality of connectors, an isolation resistor coupled between each said first node and a test signal input line, a first power node coupled to a power voltage input line, a first ground node coupled to a ground voltage input line, and a first passing node coupled to said first node;
  a plurality of second jumper circuits each having a second power node coupled to said first power node, a second ground node coupled to said first ground node, and a second passing node coupled to said test signal input line; and
  a plurality of jumpers for selectively coupling said first power node or said first ground node to said first passing node, and for selectively coupling said second power node or said second ground node to said second passing node, thereby providing at least one selectable burn-in test signal to said target semiconductor device inserted in said socket.

9. A universal burn-in board circuit as in claim 8, wherein said universal burn-in board circuit is installed on a printed circuit board substrate.

10. A universal burn-in board circuit as in claim 9, wherein said first jumper circuit and said second jumper circuit further comprise strip sockets and each one of said plurality of jumpers comprises a wire connection.

11. A universal burn-in board circuit as in claim 9, wherein each one of said plurality of jumpers comprises a switch.

12. A universal burn-in board circuit as in claim 9, wherein each one of said plurality of jumpers comprises a printed circuit.

13. A universal burn-in board circuit as in claim 9, wherein each one of said plurality of jumpers comprises a fuse circuit.

14. A universal burn-in board circuit as in claim 9, wherein each one of said plurality of jumpers comprises a wire.

15. A universal burn-in board circuit comprising:
  a plurality of sockets each having a plurality of connectors where target semiconductors to be burned-in are inserted;
  a plurality of first jumper circuits each having a first node coupled to one of said plurality of connectors, an isolation resistor coupled between each said first node and a test signal input line, a first power node coupled to a power voltage input line, a first ground node coupled to a ground voltage input line, and a first passing node coupled to said first node;
  a plurality of second jumper circuits each having a second power node coupled to said first power node, a second ground node coupled to said first ground node, and a second passing node coupled to said test signal input line; and
  a plurality of jumpers for selectively coupling said first power node or said first ground node to said first passing node, and for selectively coupling said second power node or said second ground node to said second passing node, thereby providing at least one selectable burn-in test signal to each said target semiconductor device inserted in each said socket.

16. A universal burn-in board circuit as in claim 15, wherein said universal burn-in board circuit is installed on a printed circuit board substrate.

17. A universal burn-in board circuit as in claim 16, wherein said first jumper circuit and said second jumper circuit further comprise strip sockets and each one of said plurality of jumpers comprises a wire connection.

18. A universal burn-in board circuit as in claim 16, wherein each one of said plurality of jumpers comprises a switch.

19. A universal burn-in board circuit as in claim 16, wherein each one of said plurality of jumpers comprises a printed circuit.

20. A universal burn-in board circuit as in claim 16, wherein each one of said plurality of jumpers comprises a fuse circuit.

21. A universal burn-in board circuit as in claim 16, wherein each one of said plurality of jumpers comprises a wire.

* * * * *